United States Patent [19]

Morley

[11] Patent Number: 4,603,466
[45] Date of Patent: Aug. 5, 1986

[54] WAFER CHUCK

[75] Inventor: Morgan J. Morley, Menlo Park, Calif.

[73] Assignee: GCA Corporation, Andover, Mass.

[21] Appl. No.: 581,058

[22] Filed: Feb. 17, 1984

[51] Int. Cl.[4] .............................................. F28F 13/00
[52] U.S. Cl. ...................................... 29/569 R; 51/235; 118/50; 269/21; 279/3; 165/80.5
[58] Field of Search ............... 51/235, 217 R; 125/35; 118/503, 728, 50, 59, 69, 724; 269/21; 279/3, 1 W; 29/569 R; 165/80.1, 80.5, 185

[56] References Cited

U.S. PATENT DOCUMENTS

| 3,566,960 | 3/1971 | Stuart | 204/298 |
|---|---|---|---|
| 4,261,762 | 4/1981 | King | 148/1.5 |
| 4,282,924 | 8/1981 | Faretra | 165/80 C |
| 4,457,359 | 7/1984 | Holden | 118/728 |
| 4,508,161 | 4/1985 | Holden | 118/728 |
| 4,512,391 | 4/1985 | Harra | 118/69 |

OTHER PUBLICATIONS

Hammer, "Cooling Ion-Implantation Target", IBM Technical Disclosure Bulletin, 19, 6, (1976).
Carbone et al., "Ultra-High Vacuum Evaporation/-Sputtering Apparatus for Cryogenic Thin Film Technology", IBM Tech. Disclosure Bulletin, 22, 2 (1979).
Egerton et al., "Positive Wafer Temperature Control to Increase Dry Etch Throughput and Yield" Solid State Tech., Aug. (1982).
"Plasma/Rie Etcher" Ionics, 1982.

Primary Examiner—Aaron Weisstuch
Assistant Examiner—John T. Callahan
Attorney, Agent, or Firm—Henry D. Pahl, Jr.

[57] ABSTRACT

The wafer chuck disclosed herein is adapted to hold a semiconductor wafer during high energy treatment in a vacuum environment. The wafer is clamped by its rim to a circular domed plate so as to distort the wafer into close proximity with the domed face of the plate. Ports are provided in the face of the plate for introducing a mobile gas under controlled pressure to the interstitial space between the wafer and the domed face of the plate. An annular groove is provided around the periphery of the domed face and this groove is connected to a vacuum pumping means thereby to minimize leakage of the mobile gas into the vacuum environment.

5 Claims, 2 Drawing Figures 4,603,466

WAFER CHUCK

BACKGROUND OF THE INVENTION

The present invention relates to a chuck for holding a semiconductor wafer and more particularly to such a chuck adapted to hold a wafer during high energy treatment in a vacuum environment.

In the manufacture of semiconductor integrated circuits, various treatments of the basic semiconductor wafer are conducted in a vacuum environment and involve the application of significant energy densities to the face of the wafer. Examples of such treatments are reactive ion etching (RIE) and ion implantation. Further, during these treatments, the surface of the wafer may be coated with a photosensitive resist which may not be subjected to excessive temperatures. The transfer of heat out of the wafer is complicated by the vacuum environment since energy transfer is, in a vacuum, accomplished mainly by radiation and this method of heat transfer is highly limited even if there is a heat sink e.g., a cool metal plate, in close proximity to the back of the wafer.

It has previously been proposed to introduce a mobile gas such as hydrogen or helium into a space between the wafer and a vacuum plate while providing an annular seal to prevent gross leakage of the gas into the vacuum environment. In practice however, it has been found that the resultant undefined deflection of the wafer caused by the back pressure has led to uneven heat transfer. Further, the presence of elastomeric seals has been found to be undesirable because of their degeneration and decomposition in high energy treatment environments.

Among the several objects of the present invention may be noted the provision of chuck apparatus for holding a semiconductor wafer during high energy treatment in a vacuum environment; the provision of such a chuck which provides a high rate of heat transfer from the wafer being treated; the provision of such chuck apparatus which provides highly uniform transfer of heat over the entire width of the semiconductor wafer; the provision of such apparatus which minimizes leakage of gas into the vacuum environment; the provision of such chuck apparatus which is highly reliable and which is of relatively simple non-contaminating and inexpensive construction. Other objects and features will be in part apparent and in part pointed out hereinafter.

SUMMARY OF THE INVENTION

In a wafer chuck according to the present invention, a semiconductor wafer is clamped to a circular backing plate having a domed face. The wafer is clamped by its rim thereby to distort the wafer into close proximity with the domed face of the plate. In the face plate, a plurality of gas supply ports, preferably including a ring groove spaced slightly in from the edge of the wafer, maintain a uniform, controlled pressure in the interstitial space between the wafer and the domed face while, around the periphery of the plate, an annular groove is provided which is connected to vacuum pumping means to prevent significant loss of the mobile gas into the vacuum environment.

BRIEF DESCRIPTION OF THE DRAWINGS

Corresponding reference characters indicate corresponding parts throughout the several view of the drawings.

DESCRIPTION OF THE PREFERRED EMBODIMENT

Figure 1:
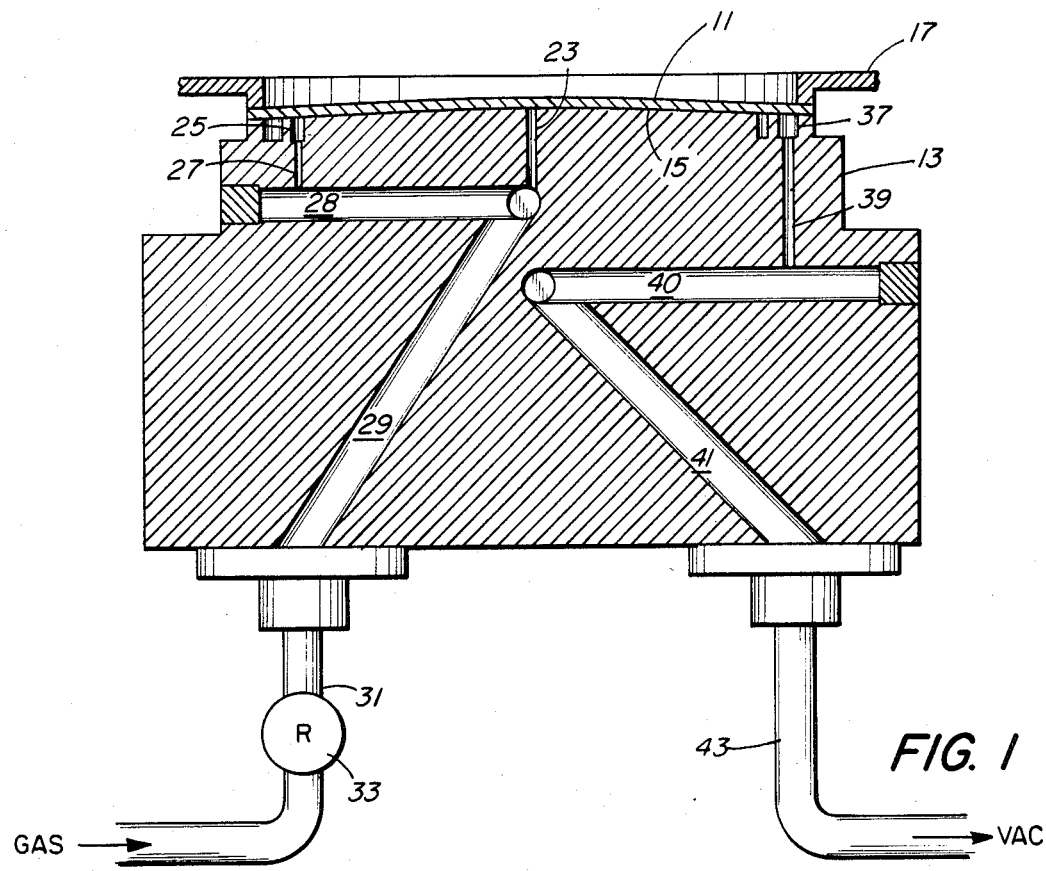
FIG. 1 is a side view, in section, of a wafer chuck constructed in accordance with the present invention.
Figure 2:
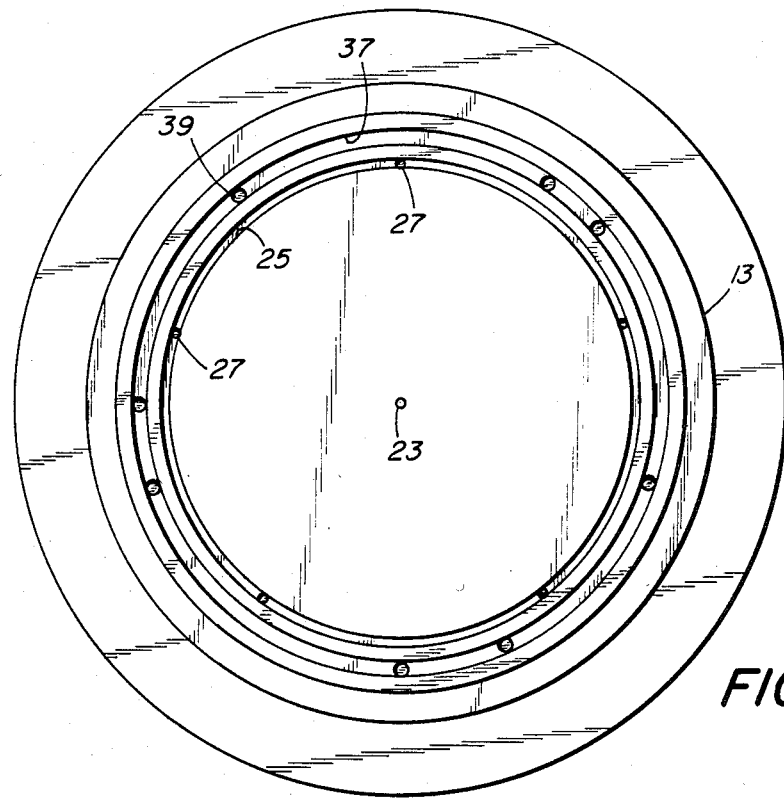
FIG. 2 is a plan view of a wafer backing plate employed in the chuck.

Referring now to FIG. 1, a semiconductor wafer to be treated is indicated generally by reference character 11. Underlying the wafer 11 is a circular backing plate 13 which is provided with a domed face 15, this being the face which directly underlies the wafer 11. The wafer 11 is clamped to this domed face by means of an annular clamp ring 17 which engages only the outer rim or periphery of the wafer 11. The wafer is clamped to the backing plate so as to distort the wafer into close proximity with the domed face 15. The curvature of the domed face of the plate 13 is selected to correspond to the curvature of a freely supported circular plate subjected to a predetermined uniform pressure.

In the drawings, the doming of the face 15 and the distortion of the wafer are exaggerated for purposes of illustration. In actual practice, a spherical doming having a radius of about 231 inches has been found appropriate for standard 100 mm (3 inch) semiconductor wafers and a pressure of 10 Torr. As will be understood, this radius should increase essentially proportionally for larger wafer sizes and/or larger pressures. Stated in another fashion, the doming corresponds to about 45 minutes of arc.

A mobile gas is provided to the interstitial space between the wafer and the backing plate 13 by means of a central port 23 and an annular groove 25 which is spaced in slightly from the periphery of the wafer. Central port 23 and groove 25 are connected, through internal ports 27-29, to a supply line 31. Line 31 is connected, through a regulator 33, to a suitable supply of the mobile gas, e.g., hydrogen or helium. As will be understood by those skilled in the semiconductor processing art, the particular mobile gas used should be selected taking into consideration the particular treatment being performed, so that such leakage of the gas as does occur will not poison that process.

Outboard of the annular groove 25 is a second, somewhat larger annular groove, this groove being designated generally by reference character 37. Annular groove 37 is connected, through internal ports 39 and 41 to a vacuum line 43 which in turn connects to a suitable vacuum pump. Annular groove 37 is preferably located just inside the minimum radius which might be contacted by any flat on the wafer, such flats being typically provided on semiconductor wafers for orientation purposes, as is well known by those skilled in the art. The purpose of annular groove 37 is to provide scavenging of any of the mobile gas which may be leaking radially outwardly through the interstitial space between the wafer 11 and the domed face 15 of the backing plate 13.

As compared with various prior art constructions, it will be seen that the chuck apparatus of the present invention provides very close and intimate contact between the wafer and the backing plate due to the domed nature of the plates face and the rim clamping of the wafer. Further, such interstitial space as does remain is filled with a mobile gas so that heat conduction from the wafer to the backing plate is greatly enhanced. Thus, higher power levels can be utilized in the treatment of the wafer surface without reaching high temperatures as might degrade a resist coating thereon. Further, because of the close fit between the wafer and the backing plate, the annular vacuum pumping groove 37 can essentially eliminate the escape of the mobile gas into the vacuum environment of the treatment process, without the use of any elastomeric seals as might be degraded by the treatment process.

In view of the foregoing, it may be seen that the several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

I claim:

1. Apparatus for holding a semiconductor wafer during high energy treatment in a vacuum environment, said apparatus comprising:
   a circular plate having a domed face;
   means for engaging and clamping the rim of a wafer aligned with said plate thereby to distort the wafer into close proximity with the domed face of said plate whereby an interstitial space is formed between the wafer and said domed face of said plate;
   in said plate, first port means for providing a mobile gas under controlled pressure to the said interstitial space between said wafer and the domed face of said plate;
   around the periphery of the face of said plate, an annular groove; and
   in said plate, second port means for connecting said annular groove to vacuum pumping means whereby leakage of said mobile gas to the environment is prevented.

2. Apparatus as set forth in claim 1 wherein said domed faces subtends about 45 minutes of arc.

3. Apparatus as set forth in claim 1 wherein said first port means comprises a central opening and a second annular groove which is inboard of the first said annular groove.

4. A method of treating a semiconductor wafer in a vacuum environment, said method comprising:
   clamping the rim of a wafer aligned on a circular plate having a domed face thereby to distort the wafer into close proximity with the domed face of said plate whereby an interstitial space is formed between the wafer and said domed face of said plate;
   providing a mobile gas under controlled pressure to the said interstitial space between said wafer and the domed face of said plate; and
   through an annular groove around the periphery of the face of said plate, evacuating gas escaping through said interstitial space whereby leakage of said mobile gas to the environment is prevented.

5. Apparatus for holding a semiconductor wafer during high energy treatment in a vacuum environment, said apparatus comprising:
   a circular plate having a domed face;
   means for clamping a wafer aligned with said plate to distort the wafer into close proximity with the domed face of said plate whereby an interstitial space is formed between the wafer and said domed face of said plate;
   around the periphery of the face of said plate, an annular groove;
   in said plate first, port means for connecting said annular groove to vacuum pumping means; and
   in said plate, second port means for providing a mobile gas under controlled pressure to said interstitial space between said wafer and the domed face of said plate, said second port means comprising a central opening and a second annular groove which is inboard of the first said annular groove whereby said vacuum pump means connected to said first port means prevents leakage of said mobile gas to the atmosphere.

* * * * *